US008634193B2

(12) United States Patent
Zhou et al.

(10) Patent No.: US 8,634,193 B2
(45) Date of Patent: Jan. 21, 2014

(54) DEVICE AND METHOD USING INDUCTION TO IMPROVE NATURAL CONVECTION COOLING

(75) Inventors: Rui Zhou, West Bend, WI (US); John A. Balcerak, Muskego, WI (US); Craig R. Winterhalter, Cedarburg, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 227 days.

(21) Appl. No.: 13/310,883

(22) Filed: Dec. 5, 2011

(65) Prior Publication Data

US 2013/0141867 A1   Jun. 6, 2013

(51) Int. Cl.
*H05K 7/20* (2006.01)
*F28D 15/00* (2006.01)

(52) U.S. Cl.
USPC ............... 361/695; 361/679.48; 361/679.49; 361/679.5; 361/690; 361/692; 361/694; 165/80.2; 165/104.33; 165/121; 165/122; 454/184; 312/213; 312/223.2; 312/236

(58) Field of Classification Search
USPC .................. 361/679.46–679.51, 690–697, 361/714–728, 831, 832; 165/80.2, 80.3, 165/80.4, 80.5, 104.33, 121–126, 185; 174/50, 50.52, 520, 35 R, 35 MS, 17 R; 312/223.1, 223.2, 223.3, 236, 265, 312/213; 454/184; 363/141, 142
See application file for complete search history.

(56) References Cited

U.S. PATENT DOCUMENTS

| | | | |
|---|---|---|---|
| 3,364,838 A * | 1/1968 | Bradley .................. 312/213 |
| 3,769,551 A | 10/1973 | Corman et al. |
| 3,852,805 A | 12/1974 | Brzozowski |
| 3,852,806 A | 12/1974 | Corman et al. |
| 4,036,291 A | 7/1977 | Kobayashi et al. |
| 5,229,915 A | 7/1993 | Ishibashi et al. |
| 5,245,527 A | 9/1993 | Duff et al. |
| 5,637,918 A | 6/1997 | Tatuta |
| 5,899,265 A | 5/1999 | Schneider et al. |
| 6,400,567 B1 * | 6/2002 | McKeen et al. ............... 361/695 |
| 6,538,881 B1 * | 3/2003 | Jeakins et al. ........... 361/679.46 |
| 6,651,452 B2 * | 11/2003 | Lecke et al. .................... 62/230 |
| 6,822,866 B2 | 11/2004 | Fearing et al. |
| 6,936,767 B2 | 8/2005 | Kleinecke et al. |
| 7,088,583 B2 | 8/2006 | Brandon et al. |
| 7,218,517 B2 * | 5/2007 | Wolford et al. ............... 361/695 |
| 7,791,884 B2 | 9/2010 | Huang et al. |
| 7,869,209 B2 * | 1/2011 | Nemoz et al. ................. 361/690 |
| 8,325,479 B2 * | 12/2012 | Siracki et al. .............. 361/679.5 |
| 8,379,384 B2 * | 2/2013 | Smalen et al. ........... 361/679.51 |
| 2002/0089056 A1 | 7/2002 | Eady et al. |
| 2005/0077065 A1 | 4/2005 | Kleinecke et al. |
| 2005/0252672 A1 | 11/2005 | Kleinecke et al. |
| 2009/0065182 A1 | 3/2009 | Takahashi et al. |

FOREIGN PATENT DOCUMENTS

| | | |
|---|---|---|
| JP | 362152147 | 7/1987 |
| JP | 02001061282 | 3/2001 |
| JP | 02002119059 | 4/2002 |
| JP | 02002209391 | 7/2002 |

* cited by examiner

*Primary Examiner* — Michail V Datskovskiy
(74) *Attorney, Agent, or Firm* — Fay Sharpe LLP; R. Scott Speroff; John M. Miller

(57) ABSTRACT

An air cooled switching unit for a motor drive includes a forced air cooling chamber and a convective cooling chamber separate from the forced air cooling chamber. An exhaust port of the forced cooling chamber is configured to direct exhaust air across an outlet of the convective cooling chamber to induce an increased air flow through the convective cooling chamber thereby increasing the cooling capacity of the convective cooling chamber.

20 Claims, 3 Drawing Sheets

DEVICE AND METHOD USING INDUCTION TO IMPROVE NATURAL CONVECTION COOLING

BACKGROUND

Motor drives are power conversion systems or "converters" that operate to provide power to electric motors in a controlled fashion to control one or more motor performance parameters, such as speed, torque, etc. Low voltage current-sourced type motor drives typically receive multiphase AC input power in the range of about 240 to 690 volts, which is converted in a rectifier to DC power supplied to a DC link and provided from the DC link to an inverter. The inverter switches the DC link currents to provide AC output current to a motor load with the output current being controlled by the inverter in closed loop fashion to drive the motor at a desired speed and/or torque. The rectifier is generally an active switching type rectifier that selectively activates switches to provide current from the AC input to the DC link bus to achieve AC to DC power conversion, where the rectifier gain is controlled to provide a DC link current level at the peak current level required by the motor at any given time. The inverter, in turn, implements a switching scheme to selectively connect the motor leads to the DC link bus terminals to provide motor phase currents with controlled amplitudes, phase, and frequency to implement a particular motor control strategy based on motor performance feedback values and desired performance setpoints or profiles. Voltage source drives are similar but the DC link supplies a select constant DC voltage instead of a select constant DC current.

The rectifier and inverter switches are solid state devices such as, e.g., gate turnoff thyristors (GTOs), silicon controlled rectifiers (SCRs), insulated gate bipolar transistors (IGBTs), symmetrical gate commutated thyristors (SCGTs) or the like. Regardless of the exact type, these switches generate large amounts of heat that must be dissipated.

Commonly owned U.S. patent publication no. 2002/0089056A1 filed on Jan. 9, 2001 provides one example of such a motor drive, and the disclosure of said U.S. patent publication no. 2002/0089056A1 is hereby expressly incorporated into the present specification. U.S. patent publication no. 2002/0089056A1 discloses an air cooled motor drive wherein the switches of the rectifier and inverter are defined as "press-pack" switch devices mounted on respective printed circuit boards (PCBs). Each PCB includes a bracket adapted to be secured to a mounting location (such as a heat sink). When each PCB is operatively installed, the opposite terminals of its respective press-pack switch device are abutted with respective first and second heat sinks between which the PCB and switch are located for electrical and thermal conductivity between the heat sinks and the press-pack switch device, with electrical conductivity between the two heat sinks being controlled by the press-pack switch, itself. The heat sinks are electrically connected to power lugs which are, in turn, connected to power connectors for input or output of electrical power. The heat sinks are cooled by forced air flow generated by a fan or other source.

Commonly owned U.S. Pat. No. 7,791,884 issued on Sep. 7, 2010 provides another example of such a motor drive, and the disclosure of said U.S. Pat. No. 7,791,884 is hereby expressly incorporated into the present specification. U.S. Pat. No. 7,791,884 disclose a motor drive with heat pipe air cooling.

Other arrangements exist for cooling the switches and other components of the drive using both forced air cooling as well as convective cooling. In general, however, there is always room for improving air cooling of motor drives.

BRIEF DESCRIPTION

In accordance with the present development, an air cooled switching unit for a motor drive includes a forced air cooling chamber and a convective cooling chamber separate from the forced air cooling chamber. An exhaust port of the forced cooling chamber is configured to direct exhaust air across an outlet of the convective cooling chamber to induce an increased air flow through the convective cooling chamber thereby increasing the cooling capacity of the convective cooling chamber.

In accordance with another aspect, a switching unit for a motor drive comprises at least one heat generating component, a forced air cooling chamber in which the at least one heat generating component is located, the forced air cooling chamber adapted to channel a stream of forced air between an inlet and an exhaust outlet for cooling the at least one heat generating component, and a convective cooling chamber having a lower inlet for the intake of air and an upper outlet for exhausting air. The exhaust outlet of the forced air cooling chamber is part of a forced air flow path, and the upper outlet of the convective cooling chamber is situated at least partially within the flow path for inducing a flow of air from the lower inlet through the convective cooling chamber and exiting the upper outlet.

The unit can include a fan for generating the stream of forced air through the forced air cooling chamber. The forced air cooling chamber and the convective cooling chamber can be contained in a common housing and, in an embodiment, can be adjacent to each other. The common housing can be a motor drive cabinet. The upper outlet of the convective cooling chamber and the exhaust outlet of the forced air cooling chamber can be arranged orthogonal to each other such that the forced air flow path is perpendicular to a central axis of the upper outlet. The switching unit can further comprise an exhaust air duct for directing air exiting the exhaust outlet across the upper outlet of the convective cooling chamber. The upper outlet of the convective cooling chamber can include a plurality of passageways, at least one of the passageways being at least partially within the flow path of the forced air cooling chamber. The at least one heat generating component can include at least one of a gate turnoff thyristor, silicon controlled rectifier, insulated gate bipolar transistor or symmetrical gate commutated thyristor.

In accordance with another aspect, a cabinet for housing a switching unit for an associated motor drive having at least one heat generating component comprises a forced air cooling chamber for mounting the at least one heat generating component of the associated switching unit, the forced air cooling chamber adapted to channel a stream of forced air between an inlet and an exhaust outlet for cooling the at least one heat generating component of the associated switching unit, and a convective cooling chamber having a lower inlet for the intake of air and an upper outlet for exhausting air. The exhaust outlet of the forced air cooling chamber is part of a forced air flow path, and the upper outlet of the convective cooling chamber is situated at least partially within the flow path for inducing a flow of air from the lower inlet through the convective cooling chamber and exiting the upper outlet.

The cabinet can further comprise a housing containing the forced air cooling chamber and the convective cooling chamber. The convective cooling chamber and the forced air cooling chamber can be adjacent to each other within the housing. A fan can be supported within the housing for generating the stream of forced air through the forced air cooling chamber. The upper outlet of the convective cooling chamber and the exhaust outlet of the forced air cooling chamber can be arranged orthogonal to each other such that the forced air flow path is perpendicular to the upper outlet. The cabinet can further comprise an exhaust air duct for directing air exiting the exhaust outlet across the upper outlet of the convective cooling chamber. The upper outlet of the convective cooling chamber can include a plurality of passageways, at least one of the passageways being at least partially within the flow path of air of the forced air cooling chamber.

In accordance with another aspect, a method of cooling components of a switching unit for a motor drive comprises forcing a stream of air through a forced air cooling chamber between an intake and an exhaust outlet, providing a convective cooling chamber having an inlet and an outlet in proximity to the forced air cooling chamber, and directing the stream of air exiting the exhaust outlet of the forced air cooling chamber across the outlet of the convective cooling chamber for inducing a flow of air from the inlet through the convective cooling chamber and exiting the upper outlet. The forcing step can include using a fan to force air through the force air cooling chamber. The directing step can include using an exhaust air duct mounted to an exterior of a housing of the switching unit to redirect air exiting the exhaust outlet across the outlet of the convective chamber.

DETAILED DESCRIPTION

Figure 1:
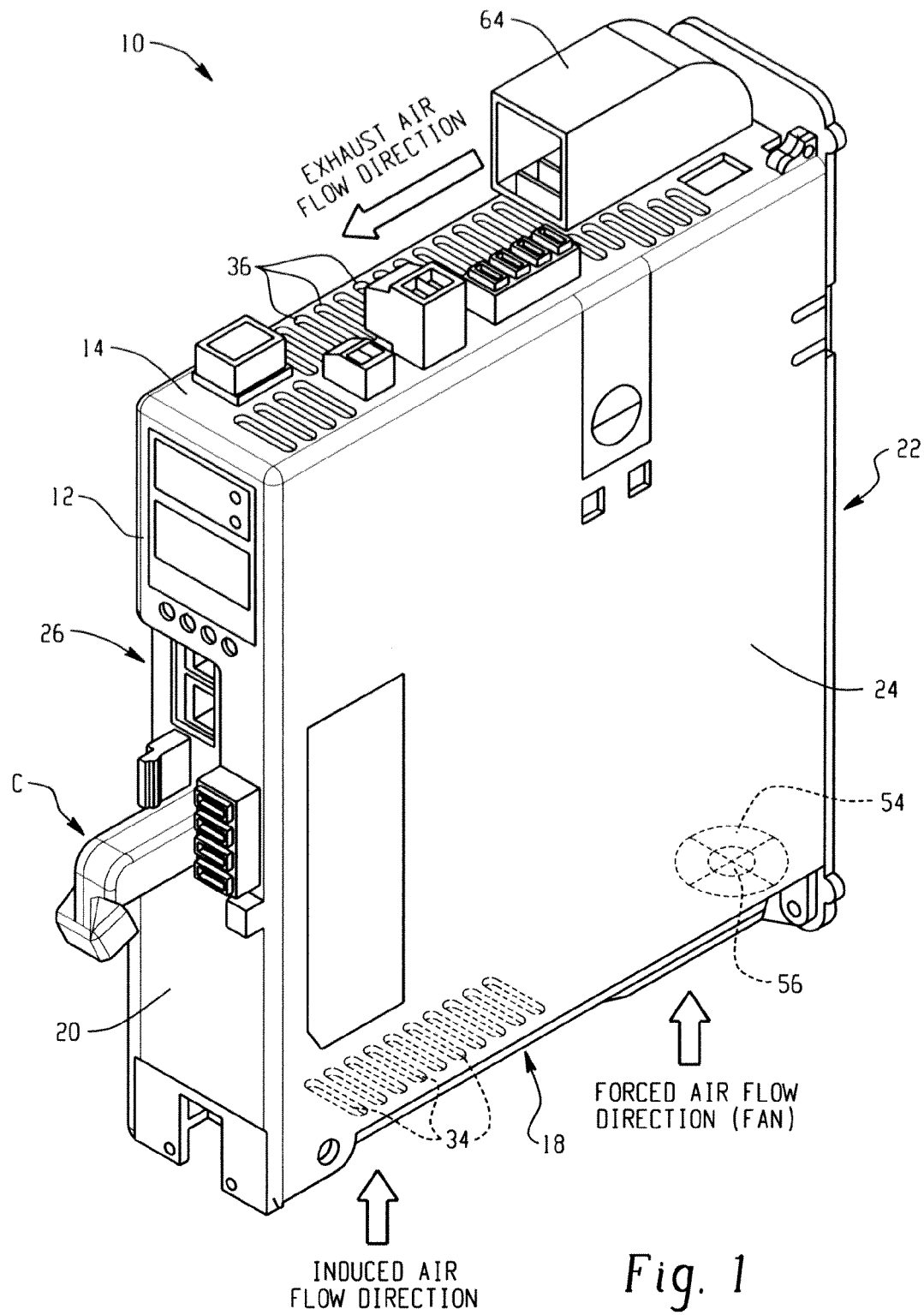
FIG. 1 is an isometric view of an exemplary motor drive in accordance with the present disclosure.

In FIG. 1, an exemplary motor drive 10 in accordance with the disclosure is illustrated for housing one or more switching units and/or other electrical components. As will be appreciated, the specific style and type of motor drive 10 is not necessarily significant and aspects of this disclosure are applicable to a wide range of electric cabinets designed to house heat-generating components, including various styles of motor drives, as well as other types of enclosures.

The motor drive 10 includes a housing 12 having a top panel 14, a bottom panel 18, a front panel 20, a rear panel 22, and side panels 24 and 26. One or more of the panels can be formed integrally, or each panel can be a separate component. The front panel 20 of the housing 12 includes one or more connectors C for connecting the drive 10 to a power source and/or a motor. The top and bottom panels 14 and 18 include openings for the flow of air into and out of the housing 12. Together, the panels of the housing 12 define an interior space I (see FIG. 2) in which switching components and/or other heat-generating components can be supported.

Figure 2:
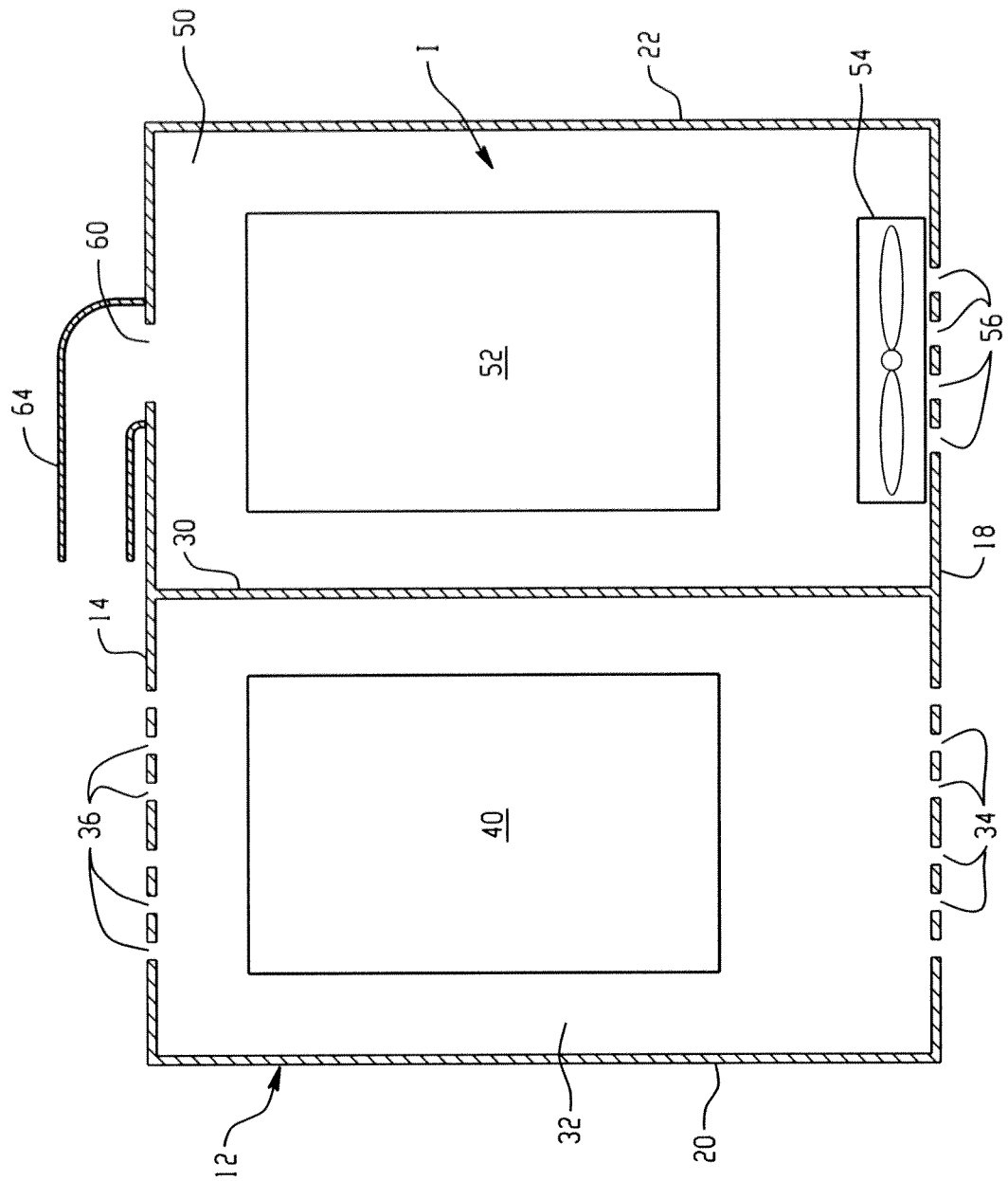
FIG. 2 is a schematic block diagram of the motor drive of FIG. 1.

With additional reference to FIG. 2, interior space I within the housing 12 is divided by a divider wall 30 into two chambers. The divider wall 30 need not be completely air tight, but in general will restrict air flow between the two chambers. The first chamber is a convective cooling chamber 32. A lower inlet 34 (that may include a plurality of passageways) in the bottom panel 18 allows for the intake of air into the convective cooling chamber 32, and an upper outlet 36 (that also may include a plurality of passageways) in the top panel 14 allows for air to exit the convective cooling chamber 32. Of course, the inlet 34 and outlet 36 could be in different locations, such as side panels 24 and/or 26. In general however, the inlet 34 to the convective cooling chamber 32 will be at a position below the outlet 36 such that natural convective forces will tend to draw air in through the inlet 34 and exhaust air through the outlet 36.

Supported within the convective cooling chamber 32 are one or more electrical components 40, such as circuit boards or the like. In general, the electrical components 40 are low power components that do not generate a large amount of heat. Such components can typically operate without the need for external cooling, but are still susceptible to performance degradation and or damage if exposed to high temperatures for a sufficient period of time. Accordingly, by housing electrical components 40 in the convective cooling chamber 32, at least some cooling is provided.

The second chamber within the housing 12 is a forced air cooling chamber 50 in which one or more electrical components 52 are supported. The electrical components 52 may be any type of electrical component including a gate turnoff thyristor, silicon controlled rectifier, insulated gate bipolar transistor or symmetrical gate commutated thyristor. The electrical components 52 in the forced air cooling chamber 50 typically generate a sufficient amount of heat such that active cooling is needed to ensure proper operation of the components and/or to prevent overheating of other components within the housing 12. It will be appreciated, however, that aspects of the present disclosure are applicable to cooling in any situation, and there need not be a heat generating component of any particular size to experience the benefits of the present disclosure.

In the illustrated embodiment, a fan 54 is situated below the electrical components 52 and is configured to draw air into the forced air cooling chamber 50 through an inlet 56, circulate air around the electrical components 52, and exhaust air via an exhaust outlet 60. The fan 54 can be an electrical axial flow fan, or other type of fan as desired. As will be appreciated, the fan 54 is one example of an air flow inducing device that can be used in accordance with the disclosure. Other devices for generating air flow can also be used. In addition, the source can be remote from the housing 12. For example, a compressed air source could be used to generate flow through the forced air cooling chamber 50.

In the past, motor drives units employed a forced air cooling chamber for cooling all of the components within the housing. In this regard, some prior art drives did not have a separate convective cooling chamber, but rather all of the electrical components resided within a forced air cooling chamber of the drive. Such an arrangement, however, still might subject certain sensitive components to excessive heat. Further, if the source of air flow fails or otherwise is interrupted, the resulting damage might affect all of the electrical components within the drive.

Accordingly, other prior art motor drives have been designed having both a forced air cooling chamber for housing higher heat generating components, and a convective cooling chamber separate from the forced air cooling chamber for housing lower heat generating components. The goal of such designs is to separate sensitive components from the main heat generating components. While these prior art designs have been successful to some extent, improvement in cooling efficiency of motor drives is desirable, particularly if such improvements do not require additional fans or other cooling devices that consume power and/or require repair or replacement.

In accordance with the present disclosure, the motor drive 10 of FIGS. 1 and 2 is configured such that the exhaust outlet

60 of the forced air cooling chamber 50 directs exhaust air flowing from the forced air cooling chamber 50 across the upper outlet 36 of the convective cooling chamber 32 thereby inducing a flow of air from the lower inlet 34 through the convective cooling chamber 32 and exiting the upper outlet 36. In the exemplary embodiment, an exhaust air duct 64 is secured to the upper panel 14 of the housing 12 and redirects the exhaust air across the upper outlet 36. The exhaust air duct 64 can be secured to the housing in any suitable manner, such as through a snap-fit connection wherein suitably sized tabs or the like are received in one or more openings of the exhaust outlet 60. Alternatively or in addition, the exhaust air duct 64 can be secured to the housing with suitable fasteners or the like. In the illustrated embodiment, the exhaust air duct 64 redirects the air exiting the exhaust outlet 60 through approximately 90 degrees.

During operation of the fan 54, air is forced through the forced air chamber 50 and out the exhaust outlet 60. The air flowing through the forced air cooling chamber picks up heat from the electrical components 52 and carries said heat out of the housing 12 via exhaust outlet 60. Meanwhile, air may be convectively circulated through the convective cooling chamber 32 via natural convection. For example, as the electronic components 33 (or other heat source) generate heat and heat the air within the convective cooling chamber 32, the air expands and rises until it exits the upper outlet 36. Fresh air is drawn in through the lower inlet 34 to replace the heated air exiting the upper outlet 36.

In addition, as the forced air exits the exhaust air duct 64 and flows across the upper outlet 36 of the convective cooling chamber 32, a pressure drop is experienced at the openings of the upper outlet 36. This pressure drop induces additional flow through the convective cooling chamber 32 thereby enhancing any existing convective circulation that may exist. Moreover, a flow may be induced in the convective cooling chamber regardless of whether a heat generating component has generated heat within the chamber sufficient to initiate a convective circulation. Thus, the present disclosure can provide initial cooling flow in the convective cooling chamber prior to any electrical component or other device generating heat.

It is noted that experiments have shown that in conventional motor drives having both a convective cooling chamber and a forced air cooling chamber, often little or no flow is detected in the convective cooling chamber unless sufficient heating is present. Thus, under normal circumstances, it is possible that the convective cooling chamber of a conventional motor drive effects little or no cooling to components supported therein. Experiments on a motor drive in accordance with the present disclosure, however, show actual air flow through the convective cooling chamber as a result of air flow induced by the passing of exhaust air across the outlet of the convective chamber. As will be appreciated, this induced flow of air can provide significant cooling as compared to a conventional motor drive.

Figure 3:
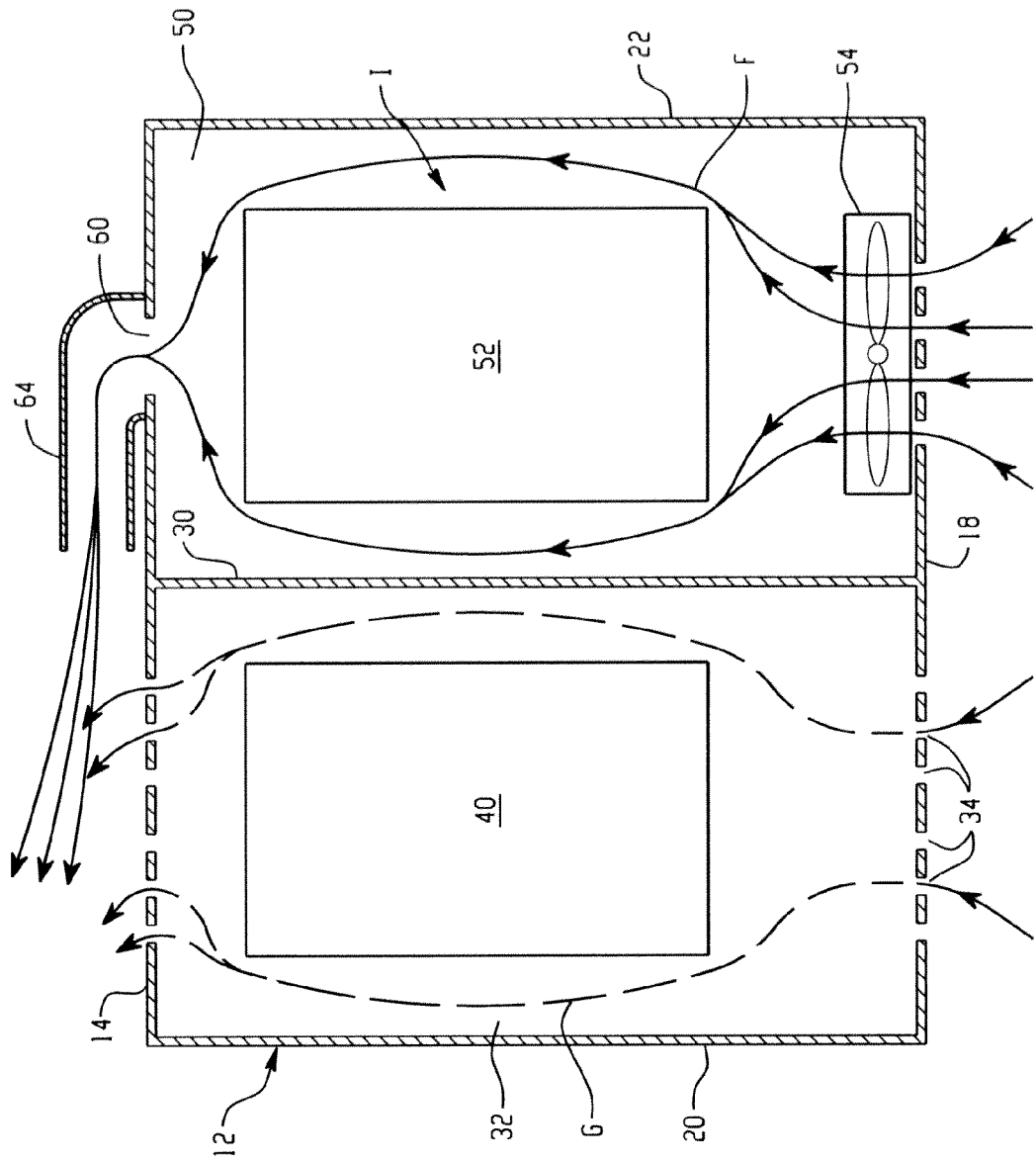
FIG. 3 is the schematic block diagram of FIG. 2, illustrating the flow path of air through the motor drive.

Turning to FIG. 3, an exemplary flow path F through the motor drive 10 is illustrated schematically. As will be appreciated, the intake 56, forced air cooling chamber 50, and exhaust outlet 60 are part of a forced air flow path F through the housing 12. The flow path F is at least partially defined by the structure of the drive 10 and determines the path along which forced air travels and picks up heat from within the forced air cooling chamber 50 and removes said heat to the exterior of the housing 12. The structure of the drive 10 directs air flow over the upper outlet 36 of the convective cooling chamber 32 where it operates to induce or enhance flow through the convective cooling chamber 32 as described above. An exemplary induced flow path through the convective cooling chamber 32 is illustrated by broken lines labeled G.

As will now be appreciated, the present disclosure provides improvements in cooling capacity of motor drives and other electrical enclosure without the use of additional cooling devices. Thus, the present disclosure sets forth a device and method that increases cooling capacity of existing systems with little or no cost to the manufacturer. While some systems could be retrofit with an exhaust air deflector, newly designed systems can integrate forced air exhaust ports with passive air outlets so as to induce additional flow in the manner described above.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A switching unit for a motor drive, said switching unit comprising:
   at least one heat generating component;
   a forced air cooling chamber in which the at least one heat generating component is located, the forced air cooling chamber adapted to channel a stream of forced air between an inlet and an exhaust outlet for cooling the at least one heat generating component; and
   a convective cooling chamber having a lower inlet for the intake of air and an upper outlet for exhausting air;
   wherein the exhaust outlet of the forced air cooling chamber is part of a forced air flow path, and the upper outlet of the convective cooling chamber is situated at least partially within the flow path for inducing a flow of air from the lower inlet through the convective cooling chamber and exiting the upper outlet.

2. A switching unit as set forth in claim 1, further comprising a fan for generating the stream of forced air through the forced air cooling chamber.

3. A switching unit as set forth in claim 1, wherein the forced air cooling chamber and the convective cooling chamber are contained in a common housing.

4. A switching unit as set forth in claim 3, wherein the common housing is a motor drive cabinet.

5. A switching unit as set forth in claim 3, wherein the convective cooling chamber and the forced air cooling chamber are adjacent to each other within the housing.

6. A switching unit as set forth in claim 1, wherein the upper outlet of the convective cooling chamber and the exhaust outlet of the forced air cooling chamber are arranged orthogonal to each other such that the forced air flow path is perpendicular to the upper outlet.

7. A switching unit as set forth in claim 1, further comprising an exhaust air duct for directing air exiting the exhaust outlet across the upper outlet of the convective cooling chamber.

8. A switching unit as set forth in claim 1, wherein the upper outlet of the convective cooling chamber includes a plurality of passageways, at least one of the passageways being at least partially within the flow path of air of the forced air cooling chamber.

9. A switching unit as set forth in claim 1, wherein the at least one heat generating component includes at least one of a gate turnoff thyristor, silicon controlled rectifier, insulated gate bipolar transistor or symmetrical gate commutated thyristor.

10. A cabinet for housing a switching unit for an associated motor drive having at least one heat generating component, the cabinet comprising:
a forced air cooling chamber for mounting the at least one heat generating component of the associated switching unit, the forced air cooling chamber adapted to channel a stream of forced air between an inlet and an exhaust outlet for cooling the at least one heat generating component of the associated switching unit; and
a convective cooling chamber having a lower inlet for the intake of air and an upper outlet for exhausting air;
wherein the exhaust outlet of the forced air cooling chamber is part of a forced air flow path, and wherein the upper outlet of the convective cooling chamber is situated at least partially within the flow path for inducing a flow of air from the lower inlet through the convective cooling chamber and exiting the upper outlet.

11. A cabinet as set forth in claim 10, further comprising a housing containing the forced air cooling chamber and he convective cooling chamber.

12. A cabinet as set forth in claim 11, wherein the convective cooling chamber and the forced air cooling chamber are adjacent to each other within the housing.

13. A cabinet as set forth in claim 10, further comprising a fan supported within the housing for generating the stream of forced air through the forced air cooling chamber.

14. A cabinet as set forth in claim 10, wherein the upper outlet of the convective cooling chamber and the exhaust outlet of the forced air cooling chamber are arranged orthogonal to each other such that the forced air flow path is perpendicular to the upper outlet.

15. A cabinet as set forth in claim 10, further comprising an exhaust air duct for directing air exiting the exhaust outlet across the upper outlet of the convective cooling chamber.

16. A cabinet as set forth in claim 10, wherein the upper outlet of the convective cooling chamber includes a plurality of passageways, at least one of the passageways being at least partially within the flow path of air of the forced air cooling chamber.

17. A method of cooling components of a switching unit for a motor drive comprising:
forcing a stream of air through a forced air cooling chamber between an intake and an exhaust outlet;
providing a convective cooling chamber having an inlet and an outlet in proximity to the forced air cooling chamber; and
directing the stream of air exiting the exhaust outlet of the forced air cooling chamber across the outlet of the convective cooling chamber for inducing a flow of air from the inlet through the convective cooling chamber and exiting the upper outlet.

18. A method as set forth in claim 17, wherein the forcing includes using a fan to force air through the force air cooling chamber.

19. A method as set forth in claim 17, wherein the directing includes using an exhaust air duct mounted to an exterior of a housing of the switching unit to redirect air exiting the exhaust outlet across the outlet of the convective chamber.

20. A method as set forth in claim 17, wherein the exhaust air duct redirects the air through at least 45 degrees.

* * * * *